(12) United States Patent
Huang et al.

(10) Patent No.: US 7,246,424 B2
(45) Date of Patent: Jul. 24, 2007

(54) MAGNETIC DEVICES HAVING MAGNETIC FEATURES WITH CMP STOP LAYERS

(75) Inventors: Picheng Huang, Eden Prairie, MN (US); Paul E. Anderson, Eden Prairie, MN (US); Laura C. Stearns, Minneapolis, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 436 days.

(21) Appl. No.: 10/823,153

(22) Filed: Apr. 13, 2004

(65) Prior Publication Data
US 2005/0225898 A1   Oct. 13, 2005

(51) Int. Cl.
*H01S 4/00* (2006.01)

(52) U.S. Cl. ............... 29/592.1; 29/603.13; 29/603.14; 29/603.15; 29/603.16; 29/603.18; 29/885; 216/22; 216/38; 216/41; 216/48; 427/127; 427/128; 438/633; 438/692; 438/693; 451/5; 451/9; 451/10; 451/16; 451/41

(58) Field of Classification Search ............... 29/592.1, 29/603.13–603.16, 603.18, 885; 216/22, 216/38, 41, 48, 65; 427/127–130; 438/633, 438/692, 693; 451/5, 9, 10, 16, 41
See application file for complete search history.

(56) References Cited

U.S. PATENT DOCUMENTS

| | | |
|---|---|---|
| 4,793,895 A | 12/1988 | Kaanta et al. |
| 5,222,329 A | 6/1993 | Yu |
| 5,234,868 A | 8/1993 | Cote |
| 5,246,884 A | 9/1993 | Jaso et al. |
| 5,337,015 A | 8/1994 | Lustig et al. |
| 5,413,941 A | 5/1995 | Koos et al. |
| 5,643,050 A | 7/1997 | Chen |
| 5,722,875 A | 3/1998 | Iwashita et al. |
| 5,731,697 A | 3/1998 | Li et al. |
| 6,073,338 A * | 6/2000 | Liu et al. ............. 29/603.14 |
| 6,207,570 B1 | 3/2001 | Mucha |
| 6,348,395 B1 | 2/2002 | Clevenger et al. |
| 6,368,184 B1 | 4/2002 | Beckage |
| 6,564,445 B1 * | 5/2003 | Hashimoto et al. ....... 29/603.14 |
| 6,595,830 B1 | 7/2003 | Hewett et al. |
| 6,599,838 B1 | 7/2003 | Shih et al. |
| 6,602,620 B1 * | 8/2003 | Kikitsu et al. ........... 428/842.2 |
| 6,620,726 B1 | 9/2003 | Preusse et al. |
| 6,621,264 B1 | 9/2003 | Lehman et al. |
| 6,624,642 B1 | 9/2003 | Lyons et al. |
| 6,628,410 B2 | 9/2003 | Doan |
| 6,706,639 B2 * | 3/2004 | Parker et al. ............... 438/706 |
| 2002/0048959 A1 | 4/2002 | Clevenger et al. |

* cited by examiner

*Primary Examiner*—Paul D. Kim
(74) *Attorney, Agent, or Firm*—Kinney & Lange, P.A.

(57) ABSTRACT

A magnetic device having a magnetic feature, the magnetic feature including a magnetic portion comprising a magnetic material, a region of non-magnetic material adjacent to the magnetic portion, and a stop layer disposed above the region of non-magnetic material, defining a planar upper boundary of the magnetic portion.

34 Claims, 6 Drawing Sheets

MAGNETIC DEVICES HAVING MAGNETIC FEATURES WITH CMP STOP LAYERS

BACKGROUND OF THE INVENTION

The present invention relates to magnetic devices having magnetic features and methods of fabricating the magnetic features. In particular, the present invention relates to magnetic devices having magnetic features for use in magnetic writers and magnetic random access memory cells, and methods of fabricating the magnetic features with chemical-mechanical polishing.

Magnetic writers used with hard drives incorporate a variety of magnetic devices having magnetic features. Examples of such magnetic devices include poles, yokes, coils, and contact plugs. Magnetic random access memory (MRAM) incorporates magnetic features for magnetic storage cells. In contrast to dynamic random access memory, which requires continuous supply of electricity, MRAM is a solid-state, non-volatile memory that uses magnetism rather than electrical power to store data.

Magnetic devices having magnetic features for use magnetic writers and MRAM cells are required to be small, generally smaller than conventional semiconductor features. The magnetic features must also have accurate dimensions, which leads to difficulties in consistent fabrication of the magnetic features due to the small sizes. Fabrication of magnetic features for magnetic devices typically includes depositing and patterning various layers of material, and subsequently removing excess material via polishing techniques, such as chemical-mechanical polishing (CMP).

CMP is used to remove surface topography in order to achieve planar surfaces suitable for photolithographic patterning of complex patterns. Material is removed during a CMP process by a combination of chemical etching and mechanical abrasion. CMP processes typically have a material removal rate of 300 to 500 nanometers (nm) per minute under normal process conditions. Removal continues until an endpoint is reached, which is theoretically the point where all of the excess material is removed, and a smooth planar surface remains. Planarized surfaces are required for creating magnetic devices for magnetic writers and MRAM cells, and for subsequent photolithography steps.

The CMP endpoint may be determined by a variety of techniques. For example, prior CMP processes have incorporated instruments to measure changes in the surface optical reflectivity, changes in the surface temperature, and changes in eddy currents induced through the layers. Other CMP processes alternatively use prior test runs to estimate polish time to the endpoint. However, these prior CMP endpoint detection techniques are subject to variations as to when the endpoints are detected. This variation, defined in terms of under-polishing and over-polishing, reduces consistency between wafer thicknesses. While these prior CMP endpoint detection techniques may be adequate for semiconductor features, such semiconductor features are larger than magnetic features required for magnetic writers and MRAM cells. In fact, these prior techniques for detecting CMP endpoints can have endpoint variations exceeding the total thickness of magnetic features required for magnetic writers and MRAM cells. Thus, there is a need in the industry for a process capable of accurately detecting CMP endpoints for fabricating consistent and accurate magnetic features.

BRIEF SUMMARY OF THE INVENTION

The present invention is directed to a magnetic device having a magnetic feature for use in magnetic writers and magnetic random access memory cells. The magnetic feature includes a magnetic portion comprising a magnetic material, a region of non-magnetic material adjacent to the magnetic portion, and a stop layer disposed above the region of non-magnetic material. The stop layer defines a planar upper boundary of the magnetic portion.

The present invention is further directed to a method of forming a magnetic feature. The method includes forming a magnetic portion between adjacent regions of non-magnetic material, depositing a stop layer over the adjacent regions to define an upper boundary of the magnetic portion, depositing material over the stop layer and the magnetic portion, and planarizing by chemical-mechanical polishing until the stop layer is reached to dimensionally define the magnetic portion.

In a preferred embodiment, the magnetic portion has a width of less than about 300 nm and a height of less than about 300 nm.

DETAILED DESCRIPTION

Figure 1:
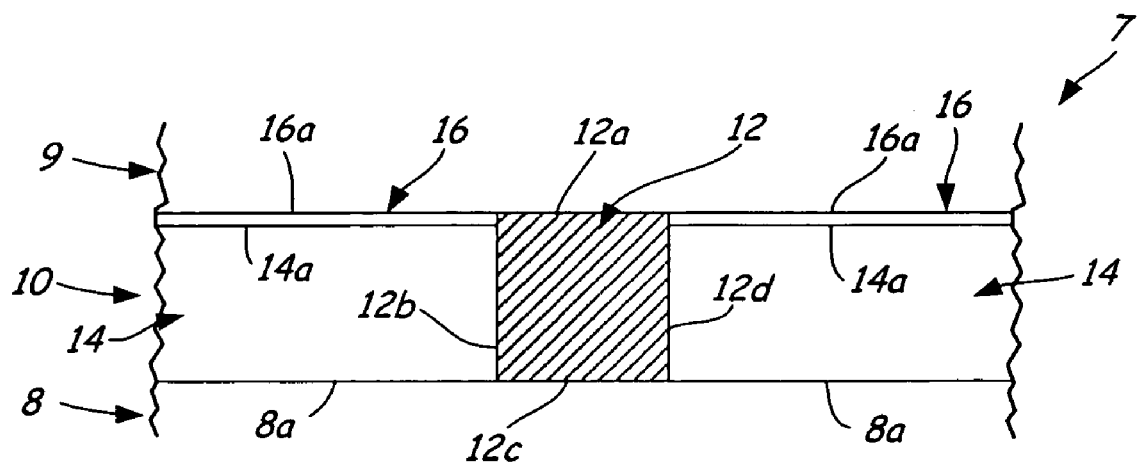
FIG. 1 is a sectional view of a magnetic device having a magnetic feature of the present invention.

FIG. 1 is a sectional view depicting a preferred embodiment of magnetic device 7 in accordance with the present invention, where magnetic device 7 embodies a variety of multi-layer structures used in magnetic writers (e.g., poles, yokes, coils, and contact plugs) and MRAM cells. Magnetic device 7 includes underlying substrate 8, overlying layer(s) 9, and magnetic feature 10 of the present invention. Underlying substrate 8 is the portion of magnetic device 7 that is formed prior to magnetic feature 10, and includes top surface 8a, upon which magnetic feature 10 is formed. Overlying layer(s) 9 is the portion of magnetic device 7 that is disposed on top of magnetic feature 10, after magnetic feature 10 is formed. Underlying substrate 8 and overlying layer(s) 9 may provide a variety of characteristics for magnetic device 7, such as additional magnetic properties or magnetic isolation.

Magnetic feature 10 is a multi-layer structure disposed between underlying substrate 8 and overlying layer(s) 9. Magnetic feature 10 includes magnetic portion 12, isolation layer 14, and stop layer 16, where stop layer 16 is used to detect a CMP endpoint. Through the use of stop layer 16, target thickness of magnetic feature 10 is accurately controlled, and within wafer non-uniformity (WIWNU) is improved.

Magnetic portion 12 is the portion of magnetic feature 10 that provides magnetic properties, and exists in a region dimensionally defined by surfaces 12a–12d. Surfaces 12b, 12d are disposed adjacent to isolation layer 14. While surfaces 12a–12d depict magnetic portion 12 as rectangular, magnetic portion 12 may alternatively be other shapes, such as trapezoidal, as discussed below. Magnetic portion 12 is derived of one or more high-magnetic-moment materials, such as a magnetic alloy. Examples of suitable magnetic alloys include iron, cobalt, nickel, and combinations thereof. Examples of suitable combinations include nickel-iron, cobalt-iron, and nickel-cobalt-iron materials.

The dimensions of magnetic portion 12 are generally small in comparison to semiconductor components. As previously discussed, small dimensions are desirable for use in magnetic writers and MRAM cells. Preferably, magnetic portion 12 has a thickness less than about 300 nm, where the thickness is the distance between surfaces 12a, 12c. Additionally, magnetic portion 12 preferably has a width less than about 300 nm, where the width is the distance between surfaces 12b, 12d. Magnetic portion 12 also has a depth that may vary as individual needs may require, where the depth extends perpendicular to the sectional view of FIG. 1. For example, where magnetic device 7 is a magnetic writer pole, the thickness and width of magnetic portion 12 may each be about 300 nm, and the depth may extend the length of the writer pole. Due to the small dimensions of magnetic portion 12, accurate control of the target thickness of magnetic feature 10 is required.

As illustrated in FIG. 1, surface 12c of magnetic portion 12 may contact top surface 8a of underlying substrate 8. This allows a magnetic contact to exist between magnetic portion 12 and an underlying substrate 8, if desired. Accordingly, magnetic device 7 may be a variety of magnetic multi-level interconnecting structures.

Isolation layer 14 is a non-magnetic layer and includes top surface 14a. Isolation layer 14 isolates magnetic portion 12 in the lateral directions of surfaces 12b, 12d. Isolation layer 14 is derived from non-magnetic materials, such as oxide materials. Examples of suitable oxide materials include aluminum oxide ($Al_2O_3$), silica dioxide ($SiO_2$), $SiO_xN_y$, and combinations thereof. An example of a particularly suitable material includes aluminum oxide.

Isolation layer 14 may have a thickness as individual needs may require, where the thickness of isolation layer 14 is the distance between top surface 14a and top surface 8a of underlying substrate 8. Preferably, isolation layer 14 has a thickness less than the thickness of magnetic portion 12 to account for the thickness of stop layer 16 (i.e., the thickness of magnetic portion 12 equals the combined thicknesses of isolation layer 14 and stop layer 16).

Stop layer 16 is disposed on top surface 14a of isolation layer 14 adjacent to surfaces 12b, 12d of magnetic portion 12. Stop layer 16 includes top surface 16a and provides a means for detecting the CMP endpoint for planarizing magnetic feature 10. This provides an accurate control of the target thickness of magnetic feature 10. Preferably stop layer 16 has a thickness between about 2–100 nm, and more preferably between about 2–10 nm, where the thickness is the distance between top layers 16a of stop layer 16 and top layer 14a of isolation layer 14.

Stop layer 16 is non-magnetic, corrosion resistant, and has high removal rate selectivity versus the magnetic alloys of magnetic portion 12 and magnetic isolation materials of isolation layer 14 (i.e., relatively high abrasion resistance). By being non-magnetic, stop layer 16 assists isolation layer 14 in magnetically isolating magnetic portion 12 in the lateral directions of surfaces 12b, 12d. Corrosion resistance is also desired so that stop layer 16 withstands chemical attacks by CMP slurries.

Preferably, the selectivities of the materials for stop layer 16 versus the magnetic alloys of magnetic portion 12 and magnetic isolation materials of isolation layer 14 are at least about eighty-to-one. Examples of suitable materials for stop layer 16 include platinum, gold, chromium, ruthenium, diamond, tungsten, SiC, $SiO_xN_y$, NiCu, and combinations thereof. An example of a particularly suitable material for stop layer 16 is chromium. Chromium is non-magnetic, corrosion resistant, and provides a high selectivity versus materials for magnetic portion 12 and isolation layer 14.

Stop layer 16 provides a means for accurately detecting the endpoint of a CMP process, which may be accomplished in several manners. First, the CMP endpoint may be detected based upon measurable fluctuations in the motor current of a CMP apparatus (not shown). These fluctuations are induced by changes in polishing friction during a polishing process (i.e., changes in removal rates), and correlate to the differences in removal rate selectivities between the layers. Additionally, the CMP endpoint may also be detected by changes in surface optical reflectivity and changes in eddy currents induced through the layers. The detection of the CMP endpoint through these techniques allows top surface 16a and surface 12a to be evenly planarized for providing a smooth surface for magnetic feature 10.

FIGS. 2A–2G and 3A–3D describe preferred methods of forming magnetic feature 10, prior to the formation overlying magnetic layer(s) 9. While only discussing magnetic device 7 individually, it is understood that large numbers of magnetic devices, as described herein, are generally formed simultaneously on a wafer, and are subsequently separated.

Figure 2A:
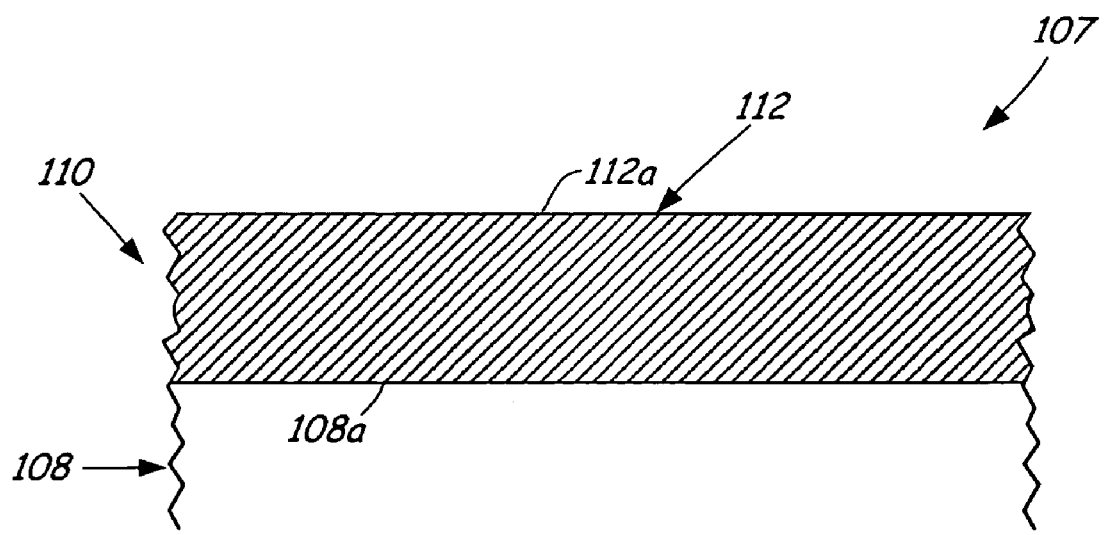
FIGS. 2A–2G are sectional views of the magnetic device having the magnetic feature of the present invention, where the magnetic feature is formed by an oxide fill method according to a first embodiment of the present invention.

FIGS. 2A–2G are sectional views depicting an oxide fill method of forming a magnetic feature, such as magnetic feature 10, pursuant to a first embodiment of the present invention. FIG. 2A depicts magnetic device 107, which is analogous to magnetic device 7, prior to the formation of magnetic feature 10. As illustrated, magnetic device 107 includes underlying substrate 108 and magnetic feature 110 at an initial stage of formation. Magnetic feature 110 is formed by first depositing high-magnetic-moment material on top surface 108a of underlying substrate 108 to initially form magnetic portion 112 as a layer. Material depositions referred to herein may be performed by conventional methods such as electroplating, sputtering, physical vapor deposition, or chemical vapor deposition. After deposition, the layer defining magnetic portion 112 has a thickness defined by the distance between surface 112a of magnetic portion 112 and top surface 108a of underlying substrate 108.

Figure 2B:
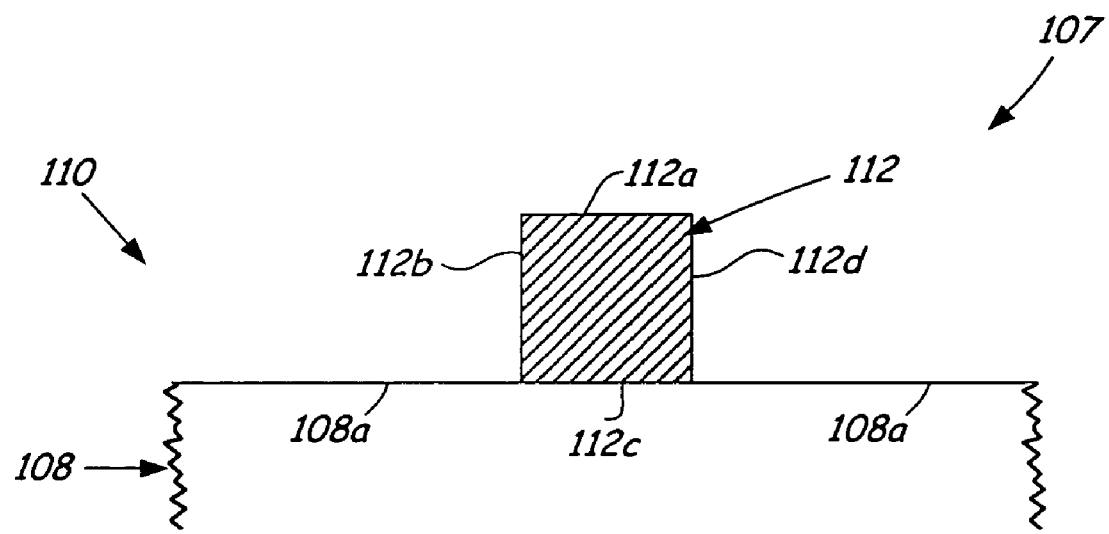

After depositing the high-magnetic-moment material, a photoresist layer (not shown) is deposited on top of surface 112a. A portion of the photoresist layer desired, which corresponds to magnetic portion 12 in FIG. 1, is polymerized to provide a mask layer. The remaining un-polymerized portion of the photoresist layer is then washed off. An etching process (e.g., ion beam etching) then removes the unmasked portions of high-magnetic-moment material. The polymerized portion of the photoresist layer is then stripped to provide magnetic portion 112, as depicted in FIG. 2B. As shown, magnetic portion 112 has dimensions defined by surfaces 112a–112d. After the etching process, magnetic portion 112 has a width defined by the distance between surfaces 112b, 112d. Correspondingly, the portions of top surface 108a of underlying substrate 108 outside magnetic portion 112 are exposed.

Figure 2C:
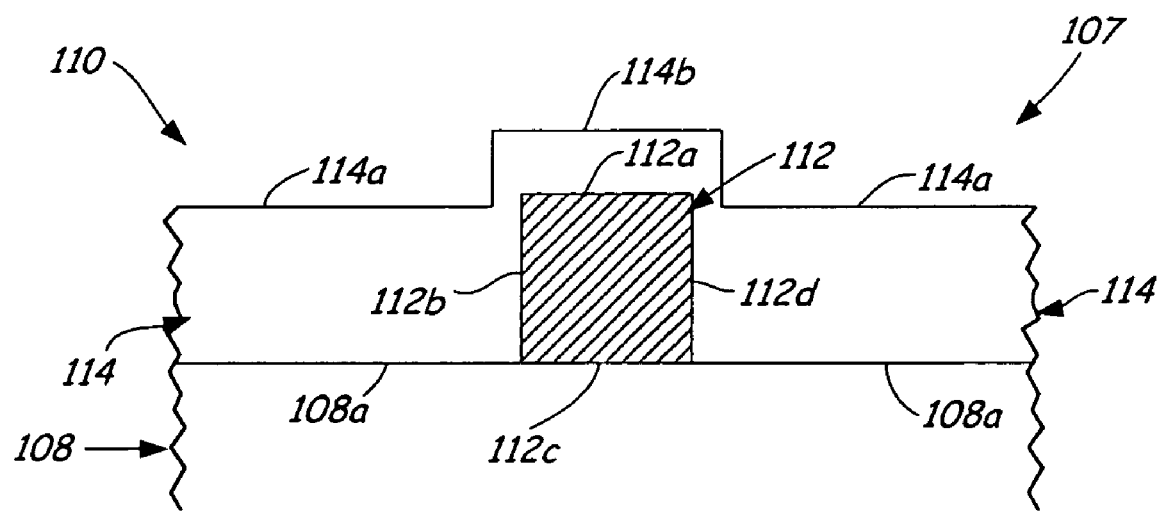

As depicted in FIG. 2C, after magnetic portion 112 is formed, non-magnetic material is deposited on top surface 108a of underlying substrate 108 and magnetic portion 112 to form isolation layer 114. After deposition, isolation layer 114 has a thickness defined by the distance between top surface 114a of isolation layer 114 and top surface 108a of underlying substrate 108. Isolation layer 114 also includes a step portion, noted by step surface 113b, formed over magnetic portion 112.

Figure 2D:
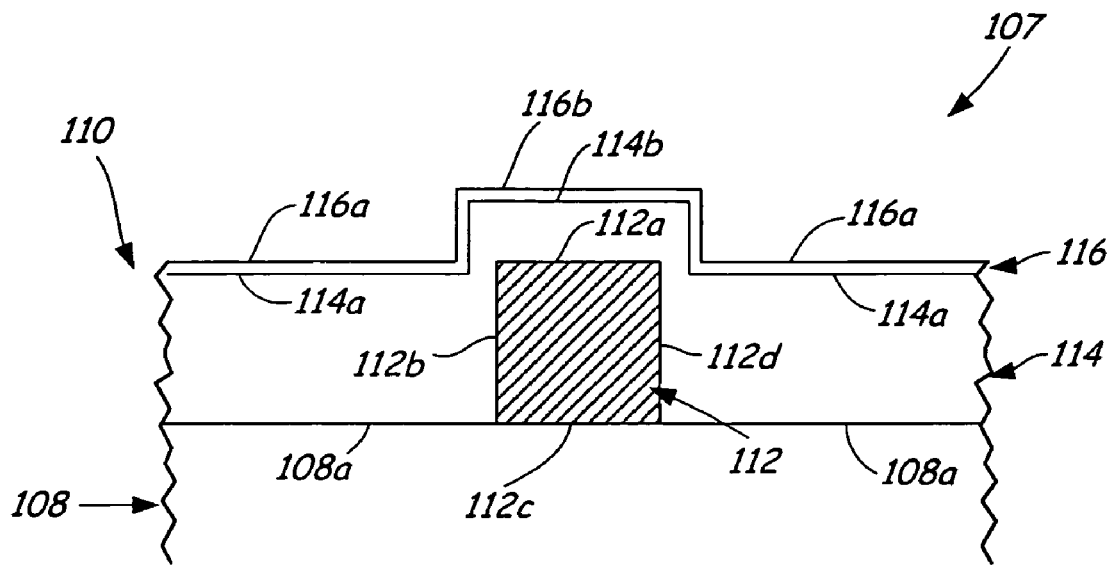

After isolation layer 114 is deposited, stop layer 116 is formed by depositing material on top of isolation layer 114. This is depicted in FIG. 2D. After deposition, stop layer 116 has a thickness defined by the distance between top surface 116a of stop layer 116 and top surface 114a of isolation layer 114. Stop layer 116 also includes a step portion, noted by step surface 116b, formed over magnetic portion 112.

As previously mentioned, it is preferable that the combined thicknesses of isolation layer 114 and stop layer 116 are generally equal to the thickness of magnetic portion 112. Alternatively, the combined thicknesses of isolation layer 114 and stop layer 116 may be less than the thickness of magnetic portion 112. In this case, the additional amount of magnetic portion 112 will be removed by the CMP process. Moreover, it is noted that the combined thicknesses of isolation layer 114 and stop layer 116 should not be greater than the thickness of magnetic portion 112. This would prevent the CMP process from planarizing magnetic feature 110 when stop layer 116 is reached.

Figure 2E:
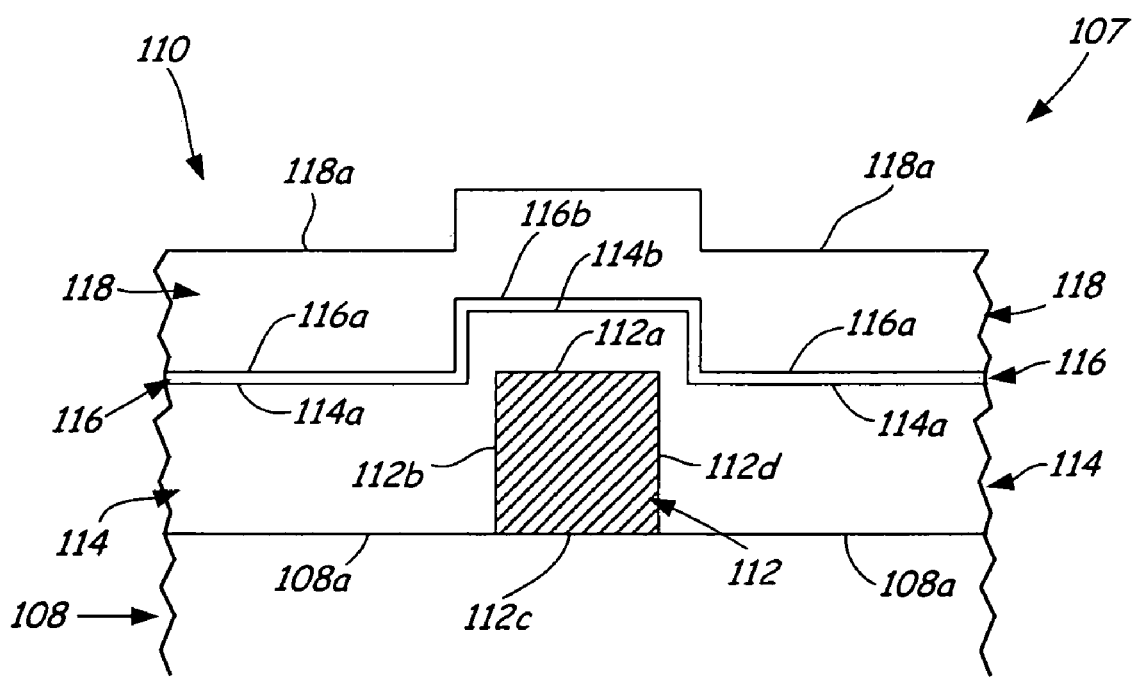

After stop layer 116 is formed, an additional layer of non-magnetic material is deposited on top of stop layer 116, as depicted in FIG. 2E to form excess layer 118. The thickness of excess layer 118 is the distance between top surface 118a of excess layer 118a and top surface 116a of stop layer 116. Excess layer 118 is incorporated to provide an adequate polishing time to remove the step portions above magnetic portion 112, noted by step surfaces 114b, 116b.

Preferred dimensions and suitable materials for magnetic portion 112, isolation layer 114, and stop layer 116 are described above in FIG. 1 for magnetic portion 12, isolation layer 14, and stop layer 16, respectively. Suitable materials for excess layer 118 include the suitable materials described in FIG. 1 for isolation layer 14. Moreover, it is desirable that the materials used for stop layer 116 have higher removal rate selectivities versus the materials used for excess layer 118. This allows the CMP process to remove excess layer 118 at a greater rate than stop layer 116. Preferred thicknesses for excess layer 118 may include those described in FIG. 1 for isolation layer 14, Generally, such thicknesses provide an adequate polish time to remove the step portions above magnetic portion 112.

After magnetic feature 110 as depicted in FIG. 2E is formed, magnetic feature 110 is polished via a CMP process to planarize magnetic feature 110 and expose magnetic portion 112. During the CMP process, material is removed from excess layer 118 by a combination of chemical etching and abrasion by the polishing pad of the CMP apparatus (not shown). While the polishing pad removes the material from excess layer 118, polishing friction is induced on the polishing pad. This polishing friction corresponds to the material removal rate and is measurable by the motor current of the CMP apparatus.

Additionally, the CMP endpoint may further be detected by changes in the surface optical reflectivities when excess layer 118 is removed and top surface 116a of stop layer 116 is exposed. The surface optical reflectivity is measured for an entire wafer, by laser or by normal light enhanced by optical fibers. The light is directed to the surface being polished (i.e., excess layer 118), reflects the light at a given angle based upon the material used for excess layer 118. As excess layer 118 is removed by the CMP apparatus, the reflectivity remains substantially unchanged. However, when stop layer 116 is reached, the reflectivity changes because of the differences in reflectivities between the materials of stop layer 116 and excess layer 118. The CMP endpoint may additionally be triggered when this change in surface optical reflectivity is detected. Those skilled in the art will appreciate and understand suitable systems for measuring the surface optical reflectivity.

The CMP endpoint may also be detected by measuring changes in electrical currents (i.e., eddy currents) induced through the layers. The electrical currents are induced from the CMP slurry through the layers of magnetic feature 110, and are detected by a sensor (not shown) located below the wafer. As material is being removed by polishing, the electrical currents correspondingly change due to the drop in electrical resistance. As such, the rate of change in the electrical currents detected correlate to the rate of material removal. Therefore, when the rate of material removal is substantially reduced (e.g., when stop layer 116 is reached), the rate of change in the electrical current is also substantially reduced. The CMP endpoint may additionally be triggered when the rate of change in the electrical current are substantially reduced. Those skilled in the art will appreciate and understand suitable systems for inducing and measuring eddy currents.

Moreover, detecting the CMP endpoint by combinations of these techniques further decreases the variations in detecting the CMP endpoint. This provides greater accuracy in controlling the thickness of magnetic feature 110.

Figure 2F:
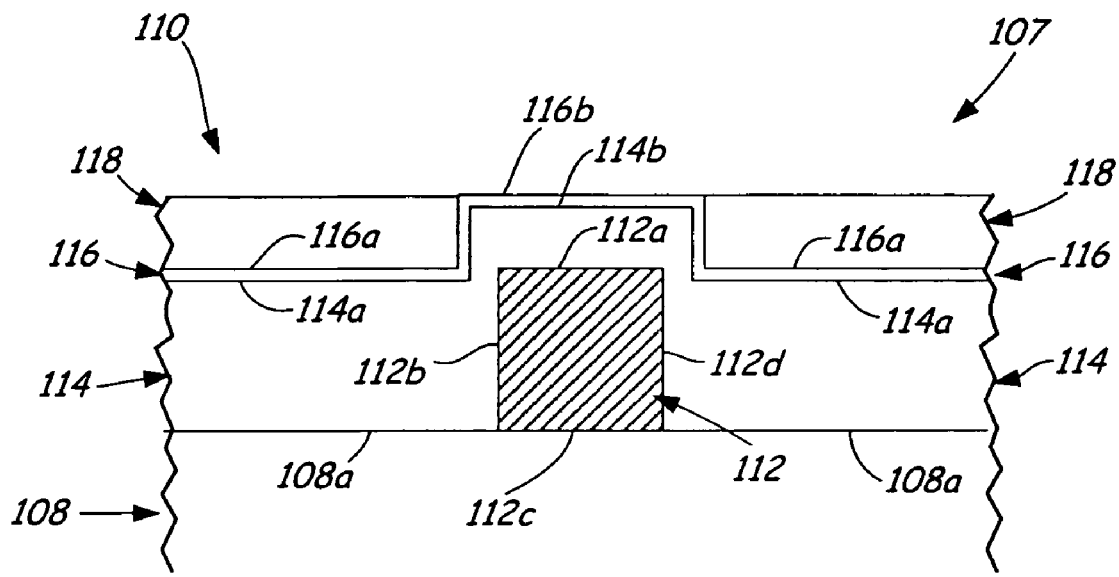

FIG. 2F depicts magnetic feature 110 after a portion of excess layer 118 has been removed such that step surface 116b of stop layer 116 is exposed. At this point, because of the higher removal rate selectivity of stop layer 116 versus excess layer 118, friction induced on the polishing pad increases (i.e., removal rate decreases). Nonetheless, the increased friction due to the encounter of step surface 116b of step layer 116 does not trigger the CMP endpoint detection. The step portion over magnetic portion 112 is relatively small compared to the overall size of magnetic feature 110. As such, the increase in the friction induced on the polishing pad at this point is not great enough to trigger the CMP endpoint detection.

Moreover, the surface optical reflectivity remains substantially unchanged because excess layer 118 still remains in the regions over top surface 116a of stop layer 116. The rates of change in the electrical current are also not substantially reduced by the reduction in the material removal rate imposed by top surface 116b of stop layer 116. Removal of material by the CMP process continues until top surface 116a of stop layer 116 is reached. At this point, due to the high removal rate selectivity of stop layer 116 versus excess layer 118, the increase in friction induced on the polishing pad is high enough to trigger the CMP endpoint detection.

Additionally, the surface optical reflectivity changes because excess layer 118 is removed to expose stop layer 116. Moreover, because the material removal rate is substantially reduced at stop layer 116, the rate of change in the induced electrical current is correspondingly reduced. These additional techniques also provide signals for triggering the CMP endpoint detection.

Figure 2G:
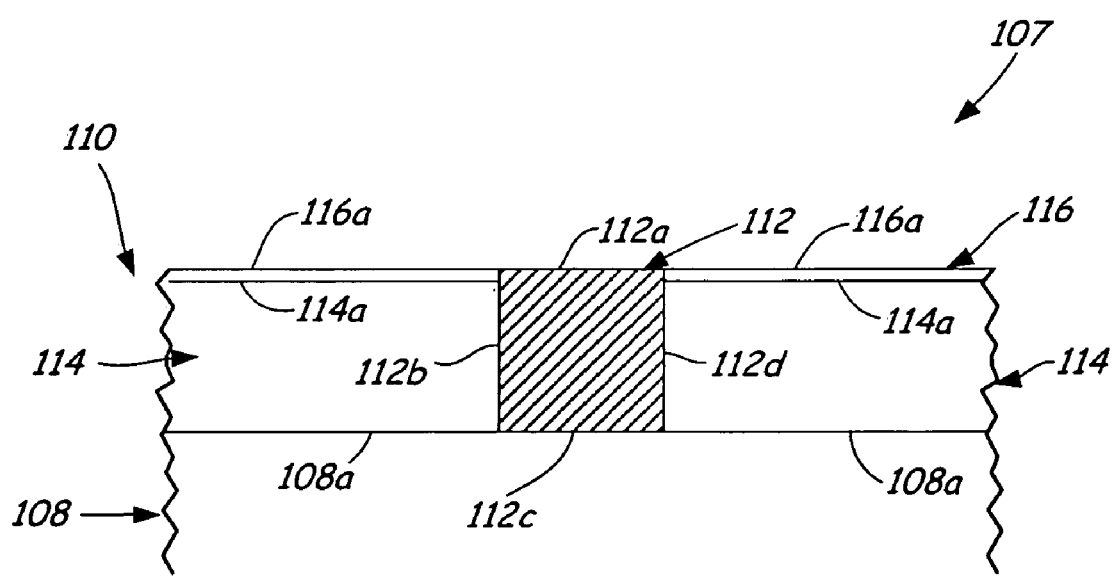

Through the use of stop layer 116, the CMP endpoint is accurately detected, which minimizes thickness variations induced by under-polishing and over-polishing. FIG. 2G depicts magnetic device 107 with magnetic feature 110 after the CMP endpoint has been detected and polishing has been stopped. The result is a smooth planar surface defined by surface 112a of magnetic portion 112 and top surface 116a of stop layer 116. The thickness of magnetic feature 110 is also accurately determined and may be consistently replicated through this method. Subsequently, overlying layer(s) 9 may be formed to provide magnetic device 10 shown in FIG. 1.

Figure 3A:
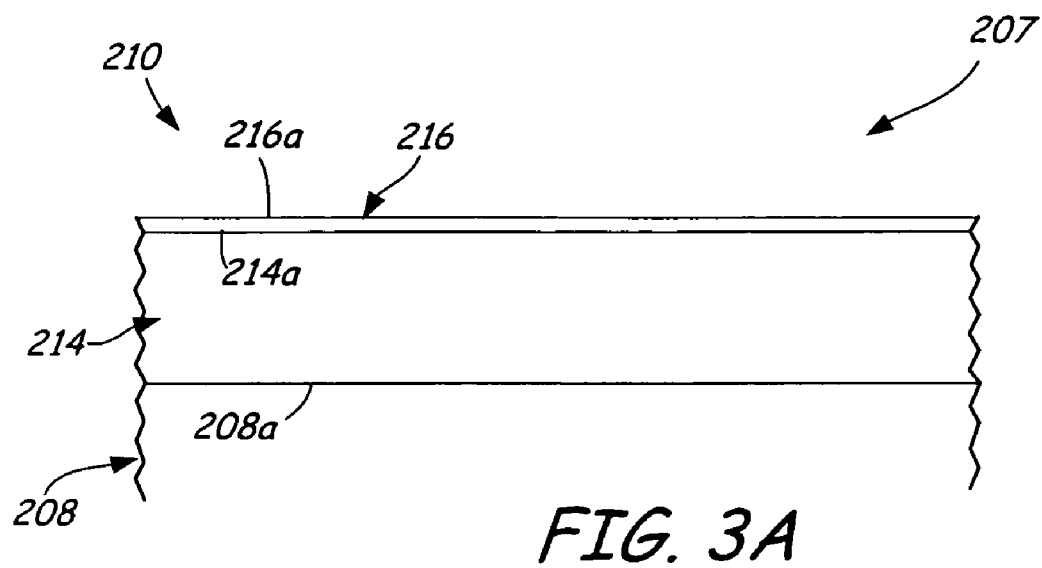
FIGS. 3A–3D are sectional views of the magnetic device having the magnetic feature of the present invention, where the magnetic feature is formed by a damascene method according to a second embodiment of the present invention.

FIGS. 3A–3D are sectional views depicting a damascene method for forming a magnetic feature, such as magnetic feature 10, pursuant to a second embodiment of the present invention. FIG. 3A depicts magnetic device 207, which is analogous to magnetic device 7, prior to the formation of magnetic feature 210. As illustrated, magnetic device 207 includes underlying substrate 208 and magnetic feature 210 at an initial stage of formation.

Magnetic feature 210 includes isolation layer 214 and stop layer 216. Preferred dimensions and suitable materials for isolation layer 214 and stop layer 216 are described above in FIG. 1 for isolation layer 14 and stop layer 16, respectively. Magnetic feature 210 is formed by first depositing non-magnetic material on top surface 208a of underlying substrate 208 to form isolation layer 214, which includes top surface 214a. Material depositions referred to herein may be performed by conventional methods such as electroplating, sputtering, physical vapor deposition, or chemical vapor deposition. After deposition, isolation layer 214 has a thickness defined by the distance between top surface 214a of isolation layer 214 and top surface 208a of underlying substrate 208.

Stop layer 216 is formed by depositing material on top of isolation layer 214, and includes top surface 216a. After deposition, stop layer 216 has a thickness defined by the distance between top surface 216a of stop layer 216 and top surface 214a of isolation layer 214.

Figure 3B:
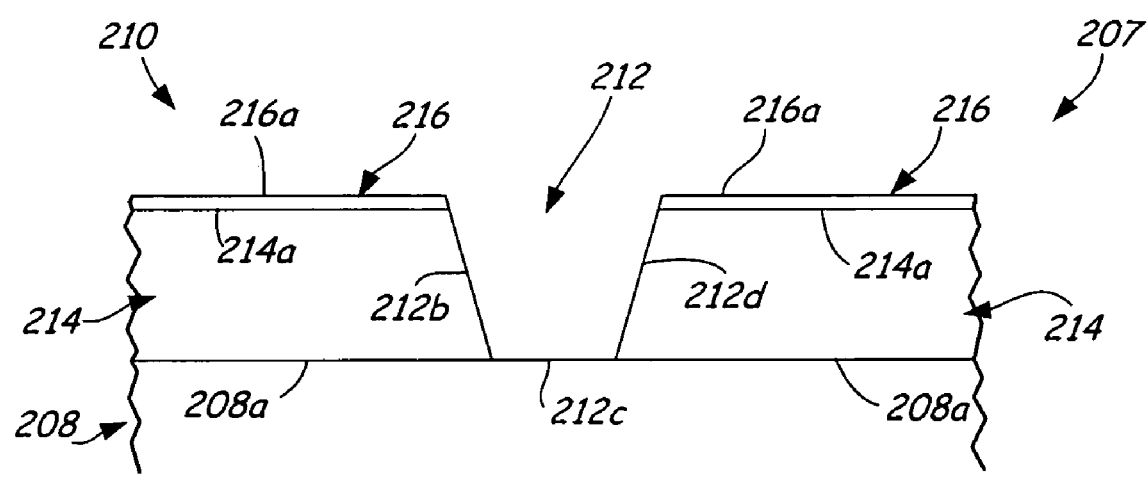

After isolation layer 214 and stop layer 216 are deposited, a photoresist layer (not shown) is deposited on top surface 216a of stop layer 216. The portions of the photoresist layer desired to be masked, which correspond to top surfaces 216 of stop layer 216 in FIG. 3B, are polymerized. The remaining portion of the photoresist layer (i.e., the portion over magnetic portion 212 in FIG. 3B) is then washed off. An etching process (e.g., ion beam etching) removes the unmasked portion of material. The polymerized portion of the photoresist layer is then stripped to provide magnetic feature 210 with magnetic portion 212 (unfilled at this point), as depicted in FIG. 3B. As shown, magnetic portion 212 dimensionally has a trapezoidal cross section, defined by surfaces 212b–212d, which is common with damascene processing. The preferred average width of magnetic portion 212 is the preferred width described above in FIG. 1 for magnetic portion 12, where the average width of magnetic portion 212 is the average distance between surfaces 212b, 212d.

Figure 3C:
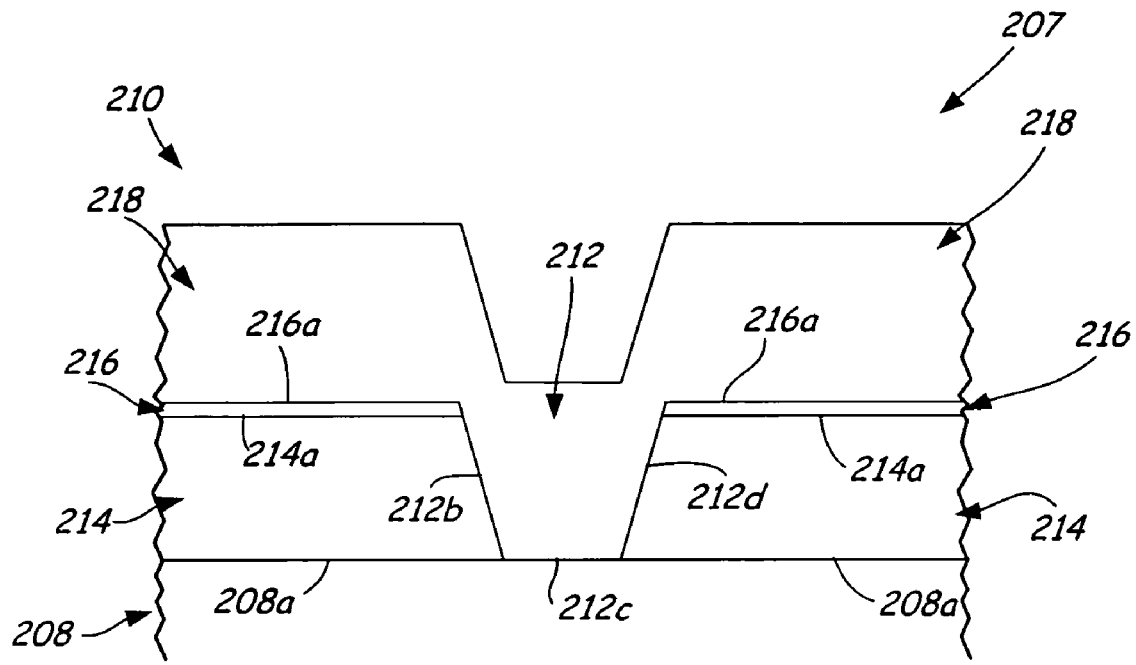

High-magnetic-moment material is then deposited within magnetic portion 212 and on top of stop layer 216. As depicted in FIG. 3C, enough high-magnetic-moment material is deposited to completely fill magnetic portion 212. The additional material located on top of magnetic portion 212 and stop layer 216 forms excess layer 218.

After magnetic feature 210 as depicted in FIG. 3C is formed, magnetic feature 210 is polished via a CMP process to planarize magnetic feature 210 and expose magnetic portion 212. During the CMP process, material is removed from excess layer 218 by a combination of chemical etching and abrasion by the polishing pad of the CMP apparatus (not shown). While the polishing pad removes the material from excess layer 218, polishing friction is induced on the polishing pad. This polishing friction corresponds to the material removal rate and is measurable by the motor current of the CMP apparatus. Additionally, as described above in FIGS. 2A–2C for magnetic feature 110, the CMP endpoint may further be detected by changes in the surface optical reflectivities, in the rates of changes in eddy currents induced through the layers, and combinations of the above-described techniques.

Removal of material by the CMP process continues until top surface 216a of stop layer 216 is reached. At this point, due to the high removal rate selectivity of stop layer 216 versus excess layer 218, the increase in friction induced on the polishing pad is high enough to trigger the CMP endpoint detection. Additionally at this point, the surface optical reflectivity changes because excess layer 218 is removed to expose stop layer 216. Similarly, because the material removal rate is substantially reduced at stop layer 216, the rate of change in the induced electrical current is correspondingly reduced. These additional techniques also provide signals for triggering the CMP endpoint detection.

Figure 3D:
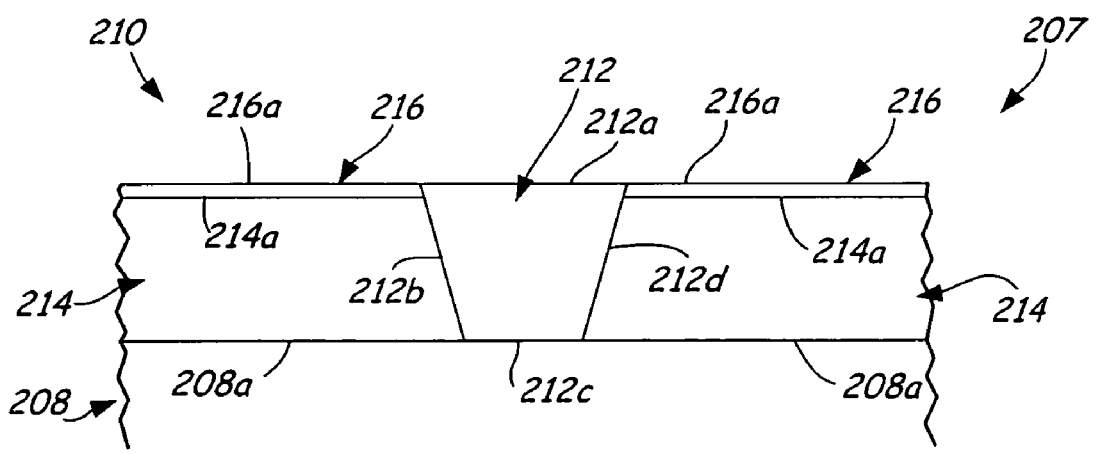

Through the use of stop layer 216, the CMP endpoint is accurately detected, which again minimizes thickness variations induced by under-polishing and over-polishing. FIG. 3D depicts magnetic feature 210 after the CMP endpoint has been detected and polishing has been stopped. The result is a smooth planar surface defined by surface 212a of magnetic portion 212 and top surface 216a of stop layer 216. The thickness of magnetic feature 210 is also accurately determined and may be consistently replicated through this method. Subsequently, top substrate 9 may be formed to provide magnetic device 10 shown in FIG. 1.

Referring generally to the embodiments described in FIGS. 2A–2G and 3A–3D, a magnetic portion (magnetic portions 112, 212) is formed between adjacent regions of non-magnetic material (isolation layers 114, 214). A stop layer (stop layers 116, 216) is deposited over the adjacent regions to define an upper boundary of the magnetic portion. Material is deposited (excess layers 118, 218) over the stop layer and the magnetic portion. The multi-layer structure (magnetic features 110, 210) is planarized by CMP until the stop layer is reached to dimensionally define the magnetic portion. This provides a magnetic device (magnetic devices 107, 207) that has a magnetic feature as described in the embodiments above.

The following discussion describes alternative embodiments to the methods described above. While referring to the first embodied method, as described in FIGS. 2A–2G, the discussion is also intended to apply to the second embodied method, and other methods of forming magnetic device 7 having magnetic feature 10 as well.

Stop layer 116 also permits a limited-time over-polishing, if required. Because of the low removal rate of stop layer 116, the CMP process may continue for a short duration after the CMP endpoint is detected. Thereafter only a minimal amount of stop layer 116 is removed. The limited time over-polish ensures all excess material is removed from the planar surface. This is especially useful where the materials used for stop layer 116 exhibits substantially low removal rates (i.e., substantially high removal rate selectivity versus the materials used for excess layer 118).

Over-polishing is also less detrimental to wafers of magnetic devices 107 having magnetic feature 110 compared to wafers of semiconductor devices. Because semiconductor features are generally larger than magnetic feature 110, over-polishing may result in a dishing effect of the conductor feature. This creates topographical indentations, which reduce the evenness of the planar surfaces. However, because magnetic portion 112 is dimensionally small, dishing effects are minimal, if they exist at all. Therefore, a limited-timed over-polishing may be used to ensure removal of all excess material without the concerns of dishing.

Additionally, stop layer 116 may be removed by the CMP polishing, as individual needs may require. In such case, the CMP endpoint is alternatively detected when the removal rate increases after stop layer 116 is removed. This again is due to the high removal rate selectivity of stop layer 116 versus magnetic portion 112 and isolation layer 114. The alternative CMP endpoint may also be detected by changes in the surface optical reflectivities. This technique works in a similar manner, as described above, however, the CMP endpoint detection is alternatively triggered when the surface optical reflectivities change due to the removal of stop layer 116 and exposure of isolation layer 114. The alternative CMP endpoint may also be detected by the rates of change in eddy currents induced through the layers. This technique also works in a similar manner to that described above. However, the CMP endpoint detection is alternatively triggered when the rate of change in electrical currents substantially increases again after stop layer 116 is removed. Because stop layer 116 does not hinder the magnetic properties of magnetic feature 110, stop layer 116 may be retained with magnetic features 110 after formation.

By detecting the CMP endpoint through a stop layer, the target thickness of the magnetic feature is accurately controlled, and WIWNU is improved. This allows a magnetic device having the magnetic feature to be fabricated accurately and consistently for use in magnetic writers and MRAM cells. Although the present invention has been described with reference to preferred embodiments, workers skilled in the art will recognize that changes may be made in form and detail without departing from the spirit and scope of the invention.

The invention claimed is:

1. A method of forming a magnetic device having a magnetic feature, the method comprising:
   forming a structure that includes a magnetic portion between adjacent regions of non-magnetic material, a stop layer over the adjacent regions, and excess material covering the stop layer and the magnetic portion; and
   planarizing by chemical-mechanical polishing until the stop layer is reached to define an upper boundary of the magnetic portion that is coplanar with an upper surface of the stop layer.

2. The method of claim 1, wherein the magnetic region is formed having a width of less than about 300 nanometers and a height of less than about 300 nanometers.

3. The method of claim 1, wherein the stop layer comprises a non-magnetic material.

4. The method of claim 3, wherein the stop layer is selected a group consisting of platinum, gold, chromium, ruthenium, diamond, tungsten, SiC, $SiO_xN_y$, NiCu, and combination thereof.

5. The method of claim 1, wherein the determination of when the stop layer is reached is based in part as a function of removal rate selectivity of the stop layer versus the excess material.

6. The method of claim 5, wherein the removal rate selectivity of the stop layer versus the material deposited over the stop layer is at least about eighty-to-one.

7. The method of claim 5, wherein the determination of when the stop layer is reached is further based in part as a function of a motor current of a chemical-mechanical polishing apparatus.

8. The method of claim 5, wherein the determination of when the stop layer is reached is further based in part as a function of a change in surface optical reflectivity.

9. The method of claim 5, wherein the determination of when the stop layer is reached is further based in part as a function of an induced eddy current.

10. The method of claim 1, wherein the forming of the structure comprises:
    forming the magnetic portion;
    depositing a layer of the non-magnetic material to form the adjacent regions;
    depositing the stop layer over the adjacent regions; and
    depositing the excess material over the stop layer and the magnetic portion.

11. The method of claim 10, wherein the forming of the magnetic feature comprises:
    depositing a layer of magnetic material;
    depositing a mask layer over the layer of the magnetic material; and
    etching the mask layer and the layer of magnetic material to form the magnetic portion.

12. The method of claim 10, wherein the determination of when the stop layer is reached is based in part as a function of removal rate selectivity of the stop layer verus the excess material.

13. The method of claim 12, wherein the determination of when the stop layer is reached is further based in part as a function of a motor current of a chemical-mechanical polishing apparatus.

14. The method of claim 12, wherein the determination of when the stop layer is reached is further based in part as a function of a change in surface optical reflectivity.

15. The method of claim 12, wherein the determination of when the stop layer is reached is further based in part as a function of an induced eddy current.

16. The method of claim 1, wherein the forming of the structure comprises:
    depositing a layer of the non-magnetic material;
    depositing the stop layer over the layer of the non-magnetic material;
    patterning a trench within the stop layer and the layer of non-magnetic material; and
    depositing magnetic material in the trench to form the magnetic portion.

17. The method of claim 16, wherein the determination of when the stop layer is reached is based in part as a function of removal rate selectivity of the stop layer verus the excess material.

18. The method of claim 17, wherein the determination of when the stop layer is reached is further based in part as a function of a motor current of a chemical-mechanical polishing apparatus.

19. The method of claim 17, wherein the determination of when the stop layer is reached is further based in part as a function of a change in surface optical reflectivity.

20. The method of claim 17, wherein the determination of when the stop layer is reached is further based in part as a function of an induced eddy current.

21. A method of forming a magnetic device having magnetic feature, the method comprising:
    forming a structure that includes a magnetic portion between adjacent regions of non-magnetic material, a stop layer over the adjacent regions, and excess material covering the stop layer and the magnetic portion, wherein the magnetic portion has a width of less than about 300 nanometers and a height of less than about 300 nanometers; and
    planarizing by chemical-mechanical polishing until and end point is reached to define an upper boundary of the magnetic portion that is coplanar with an upper surface of the stop layer, wherein the end point is determined in part as a function of removal rate selectivity of the stop layer verus the excess material.

22. The method of claim 21, wherein the stop layer comprises a non-magnetic material.

23. The method of claim 22, wherein the stop layer is selected a group consisting of platinum, gold, chromium, ruthenium, diamond, tungsten, SiC, $SiO_xN_y$, NiCu, and combination thereof.

24. The method of claim 21, wherein the endpoint is further determined in part as a function of a motor current of a chemical-mechanical polishing apparatus.

25. The method of claim 21, wherein the end point is further determined in part as a function of a change in surface optical reflectivity.

26. The method of claim 21, wherein the end point is further determined in part as a function an induced eddy current.

27. The method of claim 21, wherein the forming of the structure comprises:
    depositing a layer of magnetic material;
    depositing a mask layer over the layer of the magnetic material; and
    etching the mask layer and the layer of magnetic material to form the magnetic portion;
    depositing a layer of the non-magnetic material to form the adjacent regions;
    depositing the stop layer over the adjacent regions; and
    depositing the excess material over the stop layer and the magnetic portion.

28. The method of claim 27, wherein the endpoint is further determined in part as a function of a motor current of a chemical-mechanical polishing apparatus.

29. The method of claim 27, wherein the end point is further determined in part as a function of a change in surface optical reflectivity.

30. The method of claim 27, wherein the end point is further determined in part as a function of an induced eddy current.

31. The method of claim 21, wherein the forming of the structure comprises:
    depositing a layer of the non-magnetic material;
    depositing the stop layer over the layer of the non-magnetic material;
    patterning a trench within the stop layer and the layer of non-magnetic material; and
    depositing magnetic material in the trench to form the magnetic portion.

32. The method of claim 31, wherein the endpoint is further determined in part as a function of a motor current of a chemical-mechanical polishing apparatus.

33. The method of claim 31, wherein the end point is further determined in part as a function of a change in surface optical reflectivity.

34. The method of claim 31, wherein the end point is further determined in part as a function of an induced eddy current.

* * * * *